United States Patent
De Loijer (10) Patent No.: US 11,251,015 B2
(45) Date of Patent: Feb. 15, 2022

(54) INSPECTION TOOL AND METHOD OF DETERMINING A DISTORTION OF AN INSPECTION TOOL

(71) Applicant: ASML Netherlands B.V., Veldhoven (NL)

(72) Inventor: Peter Christianus Johannes Maria De Loijer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 45 days.

(21) Appl. No.: 16/908,507

(22) Filed: Jun. 22, 2020

(65) Prior Publication Data

US 2020/0321187 A1    Oct. 8, 2020

Related U.S. Application Data

(63) Continuation of application No. PCT/EP2018/085796, filed on Dec. 19, 2018.

(30) Foreign Application Priority Data

Dec. 22, 2017  (EP) .................................. 17210305

(51) Int. Cl.
*H01J 37/28* (2006.01)
*H01J 37/244* (2006.01)
*H01J 37/26* (2006.01)

(52) U.S. Cl.
CPC .......... *H01J 37/244* (2013.01); *H01J 37/265* (2013.01); *H01J 37/28* (2013.01);
(Continued)

(58) Field of Classification Search
CPC ............... H01J 37/28; H01J 2237/1536; H01J 2237/24578; H01J 2237/24592;
(Continued)

(56) References Cited

U.S. PATENT DOCUMENTS

2004/0021075 A1    2/2004  Nikitin
2008/0093551 A1*   4/2008  Tsuneta ............... H01J 37/153
                                                   250/310

(Continued)

FOREIGN PATENT DOCUMENTS

JP    H10-144248 A    5/1998

OTHER PUBLICATIONS

International Search Report and Written Opinion issues by the International Searching Authority in related PCT Application No. PCT/EP2018/085796, dated Mar. 29, 2019 (3 pgs.).

*Primary Examiner* — Eliza W Osenbaugh-Stewart
(74) *Attorney, Agent, or Firm* — Finnegan, Henderson, Farabow, Garrett & Dunner, LLP (57) ABSTRACT

A method of determining a distortion of a field of view of a scanning electron microscope is described. The method may include: providing a sample including substantially parallel lines extending in a first direction; performing scans across the field of view of the sample along respective scan-trajectories extending in a scan direction; the scan direction being substantially perpendicular to the first direction; detecting a response signal of the sample caused by the scanning of the sample; determining a distance between a first line segment of a line and a second line segment of the line, whereby each of the first line segment and the second line segment are crossed by scan trajectories, based on the response signal; performing the previous step for multiple locations within the field of view; and determining the distortion across the field of view, based on the determined distances at the multiple locations.

12 Claims, 7 Drawing Sheets

(52) U.S. Cl.
CPC ............... *H01J 2237/1536* (2013.01); *H01J 2237/24578* (2013.01); *H01J 2237/24592* (2013.01)

(58) Field of Classification Search
CPC ....... H01J 2237/2809; H01J 2237/2817; H01J 2237/282
See application file for complete search history.

(56) References Cited

U.S. PATENT DOCUMENTS

| | | | |
|---|---|---|---|
| 2013/0141563 A1 | 6/2013 | Setoguchi et al. | |
| 2013/0146763 A1* | 6/2013 | Kawada | G01B 15/00 250/306 |
| 2013/0301954 A1* | 11/2013 | Shirai | G06T 7/0004 382/280 |

* cited by examiner

INSPECTION TOOL AND METHOD OF DETERMINING A DISTORTION OF AN INSPECTION TOOL

CROSS-REFERENCE TO RELATED APPLICATIONS

This application claims priority to International Application No. PCT/EP2018/085796, filed Dec. 19, 2018, and published as WO 2019/121883 A1, which claims priority of EP application 17210305.3 which was filed on Dec. 22, 2017. The contents of these applications are incorporated herein by reference by their entireties.

TECHNICAL FIELD

The embodiments of the present disclosure relate to an inspection tool and a method of determining a distortion of an inspection tool.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The radiation beam as typically applied in lithographic apparatuses may e.g. be a DUV radiation beam (e.g. having a wavelength of 248 nm or 193 nm) or an EUV radiation beam (e.g. having a wavelength of 11 nm or 13.5 nm).

The manufacturing of an integrated circuit may typically require the stacking of a plurality of layers, whereby the layers need to be accurately aligned. Without such an alignment, a required connection between layers may be flawed, resulting in a malfunctioning of the integrated circuit.

Typically, the bottom layer or layers of the integrated circuit will contain the smallest structures, such as transistors or components thereof. The structures of subsequent layers are typically larger and enable connections of the structures in the bottom layers to the outside world. In view of this, an alignment of two layers will be the most challenging in the bottom portion of the integrated circuit.

In order to ensure that a circuit or a circuit layer is properly patterned, substrates are often subjected to inspection, using inspection tools such as e-beam inspection tools.

An example of such an inspection tool is a high resolution SEM (scanning electron microscope), which is e.g. used to examine dimensions of patterns on a substrate. Such a high resolution SEM typically uses electrons, with an energy between 200 eV and 30 keV, which are accelerated towards the surface of the substrate, where they diffuse into and generate new electrons (i.e. secondary electrons). Due to this, secondary and/or backscattered electrons are emitted from the surface. These secondary and/or backscattered electrons may then be recorded by a detector. By scanning an area of a substrate using a beam of electrons, information about the surface structure of the substrate can be obtained.

It would be desirable to improve the performance of e-beam inspection tools such as high resolution SEMs as currently available.

SUMMARY

The embodiments of the present disclosure relate to an inspection tool and a method of determining a distortion of an inspection tool. According to some embodiments of the present disclosure, the performance of e-beam inspection tools can be improved.

According to some embodiments of the present disclosure, a method of determining a distortion of a field of view of a scanning electron microscope is provided. The method comprises:
  providing a sample comprising a plurality of substantially parallel lines extending in a first direction;
  performing a plurality of scans across the field of view of the sample along a respective plurality of scan-trajectories extending in a scan direction; the scan direction being substantially perpendicular to the first direction;
  detecting a response signal of the sample caused by the scanning of the sample;
  determining a distance between a first line segment of a line and a second line segment of the line, whereby each of the first line segment and the second line segment are crossed by a plurality of scan trajectories, based on the response signal;
  performing the previous step for a plurality of locations within the field of view and
  determining the distortion across the field of view, based on the determined distances at the plurality of locations.

According to some embodiments of the present disclosure, there is provided an inspection tool comprising:
  an object table configured to receive a sample comprising a plurality of substantially parallel lines extending in a first direction;
  an e-beam source configured to generate an e-beam;
  a beam manipulator configured to direct the electron onto the sample;
  a detector configured to detect a response signal of the sample caused by interaction of the electron beam with the sample;
  a control unit configured to control the beam manipulator to performing a plurality of scans across the field of view of the sample along a respective plurality of scan-trajectories extending in a scan direction; the scan direction being substantially perpendicular to the first direction, wherein the control unit is further configured to perform, for a plurality of locations within the field of view, the step of determining a distance between a first line segment of a line and a second line segment of the line, whereby each of the first line segment and the second line segment are crossed by a plurality of scan trajectories, based on the response signal of the sample during the scanning, and is configured to determine the distortion across the field of view, based on the determined distances at the plurality of locations.

BRIEF DESCRIPTION OF THE DRAWINGS

Embodiments of the present disclosure will now be described, by way of example only, with reference to the accompanying schematic drawings in which corresponding reference symbols indicate corresponding parts, and in which.

DETAILED DESCRIPTION

Figure 1:
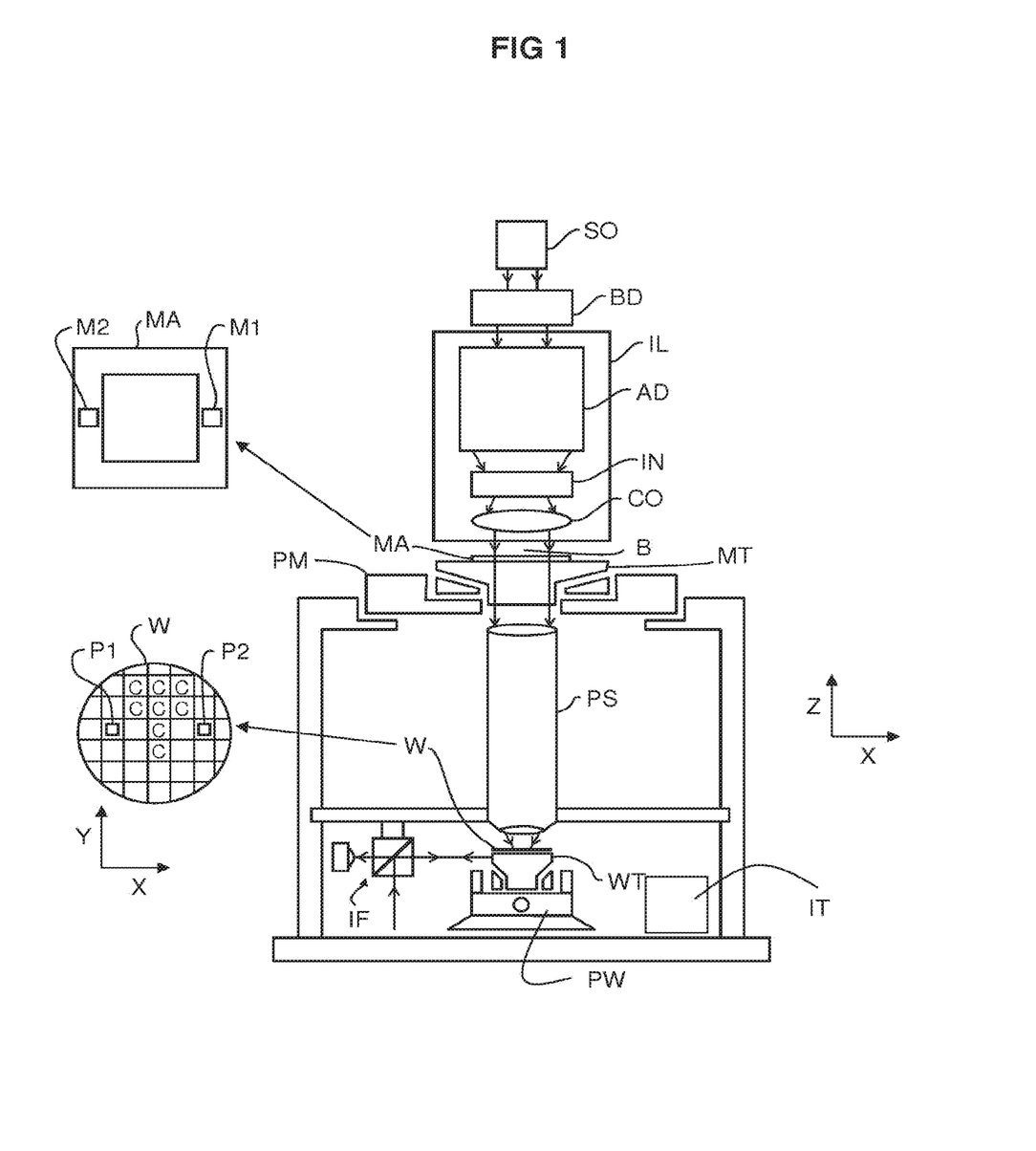
FIG. 1 depicts a lithographic apparatus according to some embodiments of the present disclosure.

FIG. 1 schematically depicts a lithographic apparatus according to some embodiments of the present disclosure. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask)

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the example as shown, the lithographic apparatus further comprises an inspection tool IT according to some embodiments of the present disclosure. Such an inspection tool IT may e.g. enable to determine a characteristic of a structure, in particular a buried structure that is present on or in an area of interest of a substrate W that is processed by the lithographic apparatus. In some embodiments, as will be discussed in more detail below, the inspection tool may comprise an electron beam source for inspecting the substrate.

In some embodiments, the second positioning device PW may be configured to position the substrate W in the operating range of the inspection tool IT. In such embodiments, the inspection tool IT may e.g. be configured to determine a characteristic of the mentioned structure, e.g. an electric characteristic, a material characteristic and/or a geometric characteristic. In some embodiments, this information may subsequently be provided to a control unit of the lithographic apparatus and used during the exposure process, e.g. by controlling one or more of the illumination system, the projection system or one of the positioning devices, based on the information.

In the example as shown, the lithographic apparatus may be configured to apply DUV radiation for the radiation beam. In such case, the patterning device MA may be a transmissive patterning device and the projection system PS may comprise one or more lenses.

Alternatively, the lithographic apparatus according to some embodiments of the present disclosure may be configured to apply EUV radiation for the radiation beam. In such case, the patterning device MA may be a reflective patterning device and the projection system PS may comprise one or more mirrors. In such embodiments, the apparatus may comprise one or more vacuum chambers for housing the illumination system IL and/or the projection system PS.

In accordance with some aspects of the present disclosure, the lithographic apparatus may comprise an inspection tool according to some embodiments of the present disclosure, in order to perform an inline or offline inspection of a substrate that is to be processed or has been processed.

Figure 2:
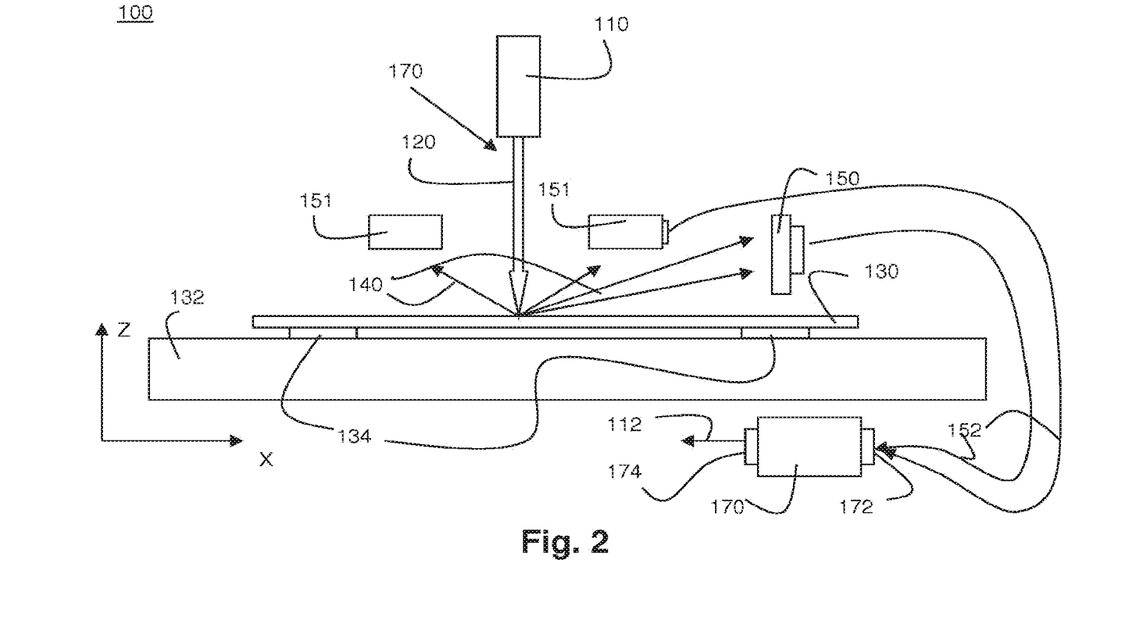
FIG. 2 depicts an inspection tool according to some embodiments of the present disclosure.

According to some aspects of the present disclosure, there is provided an inspection tool configured to inspect an object such as a semiconductor substrate. FIG. 2 schematically shows an example of such an inspection tool 100. In accordance with some embodiments of the present disclosure, the inspection tool 100 comprises an electron beam source 110, further on also referred to as an e-beam source 110.

Such an e-beam source 110 is known in general, and may be applied in some embodiments of the present disclosure to project an electron beam 120 onto an area of an object 130, e.g. a substrate. In the example as shown, the object 130 is mounted to an object table 132 by means of a clamping mechanism 134, e.g. a vacuum clamp or an electrostatic clamp. The area of the object onto which the e-beam is projected may also be referred to as sample. Such an e-beam source 110 may e.g. be used to generate an electron beam 120 having an energy ranging from 0.2 keV to 100 keV. An e-beam source 110 may typically have one or more lenses for focusing the electron beam 120 onto a spot of about 0.4 to 5 nm in diameter. In some embodiments, the e-beam source 110 may further comprise one or more scanning coils or deflector plates which may deflect the electron beam 120. By doing so, the electron beam 120 may e.g. be deflected along an X-axis and an Y-axis (perpendicular to the X-axis and the Z-axis), the XY-plane being parallel to a surface of the object, such that an area of the object can be scanned.

In some embodiments of the present disclosure, the electron beam source is configured to project a plurality of electron beams onto a respective plurality of sub-areas of the area of interest. By doing so, the area of interest that can be examined or inspected per unit of time may be enlarged. Further, in some embodiments of the present disclosure, the electron beam source may be configured to generate electron beams having a different energy level.

When such an e-beam 120 impinges on the surface, interactions on the surface and interactions with the material below the surface may occur, resulting in the exposed surface emitting both radiation and electrons. Typically, when an electron beam 120 interacts with a sample, the electrons constituting the beam may loose energy through scattering and absorption, within a teardrop-shaped volume, known as the interaction volume. The energy exchange between the electron beam and the sample may typically result in a combination of:
  an emission of secondary electrons by inelastic scattering,
  an emission of electrons that are reflected or back-scattered out of the interaction volume by elastic scattering interactions with the sample,
  X-ray emission, and
  an emission of electromagnetic radiation, e.g. in a range from deep UV to IR.
The latter emission of electromagnetic radiation is generally referred to as cathodoluminescent light or CL-light.
In some embodiments of the present disclosure, the inspection tool 100 further comprises a detector 150 for detection of secondary electrons and a detector 151 for back-scattering electrons as emitted by a sample. In FIG. 2, the arrows 140 are indicative for the emitted secondary or back-scattering electrons.

In the example as shown, the inspection tool further comprises a control unit 170 or processing unit, e.g. comprising a microprocessor, computer or the like, for processing signals representative of the emitted secondary or back-scattering electrons as detected by the detectors 150 and 151.

In some embodiments, the control unit 170 comprises an input terminal 172 for receiving signals 152 from the detectors 150, 151, the signals 152 representing the detected emitted secondary or back-scattering electrons.

In some embodiments, the control unit may further have an output terminal 174 for outputting a control signal 112 for controlling the e-beam source 110. In some embodiments, the control unit 170 may control the e-beam source 110 to project an e-beam 120 onto an area of interest of the object to be inspected, e.g. a semiconductor substrate.

In some embodiments, the control unit 170 may be configured to control the e-beam source 110 to scan the area of interest.

An inspection tool as schematically shown in FIG. 2 may e.g. be applied to assess the performance of a lithographic apparatus as e.g. shown in FIG. 1. Such an assessment may e.g. involve determining a CD uniformity of a patterned structure on a substrate. As an example of such a patterned structure, a structure comprising a plurality of parallel lines can be mentioned. In order to assess the performance of a lithographic apparatus, the sample with the patterned structure can be scanned with an electron beam as described above, while one or more of the occurring emissions due to the interaction of the sample with the electron beam are detected. Typically, a rectangular portion of a sample is scanned along a plurality of scan trajectories. The portion of the sample that is being scanned or the area covered by the plurality of scan trajectories is typically referred to as the field of view of the inspection tool.

Figure 3:
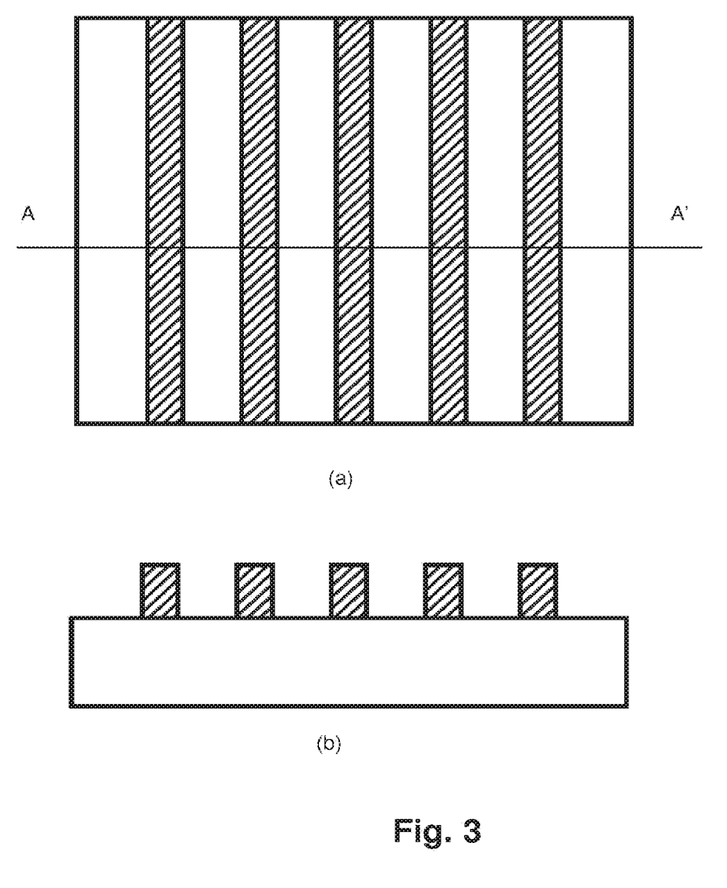
FIG. 3 schematically depicts a top view and a cross-sectional view of a structure that can be examined using an inspection tool according to some embodiments of the present disclosure.

FIG. 3 schematically shows a top view (a) and a cross-sectional view (b) of a patterned structure 300 comprising a plurality of substantially parallel lines 310. Such a structure 300 can e.g. be obtained by exposing a resist layer to a radiation beam that has been patterned by a grating. FIG. 3 (b) shows a cross-sectional view of the structure 300 along line A-A' shown in FIG. 3 (a).

FIG. 3 would thus describe the ideal structure one would expect after the exposure and developing process. In order to assess the performance of these processes, the pattered structure as actually obtained by the processes can be examined or inspected using inspection tool such as a SEM.

Figure 4:
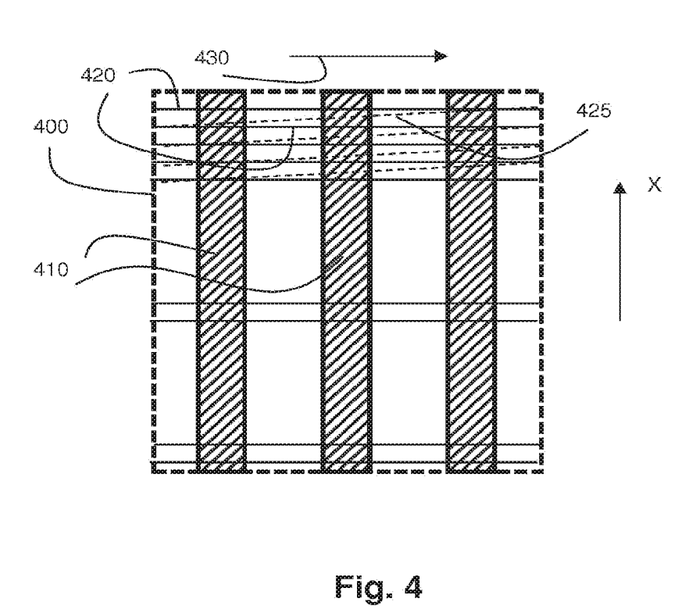
FIG. 4 schematically depict a plurality of scan trajectories as can be applied for scanning a sample comprising a plurality of lines.

In such an inspection tool, the sample is scanned across the field of view of the inspection tool. This scanning process typically involves performing a plurality of scans along a respective plurality of scan trajectories said scan trajectories being substantially parallel to each other and extending in a scan direction. FIG. 4 schematically shows a top view of a field of view 400 of an inspection tool covering part of a sample which comprises portions of three substantially parallel lines 410 extending in the indicated X-direction. FIG. 4 further shows several scan trajectories 420 along which an electron beam is propagated during the scanning process. During such a scan process, an electron beam scans the sample along the indicated scan trajectories, e.g. in the scan direction 430 while, in between the scanning along two adjacent scan trajectories, the electron beam is turned off or blocked and repositioned at the start of the next scan trajectory, the repositioning being indicated by the dotted lines 425.

Typically, a field of view of the inspection tool may e.g. cover an area of 2×2 micrometer or smaller. In order to scan the entire field of view, typically several tens or hundreds of scans along scan directories are performed to cover the field of view.

Figure 5:
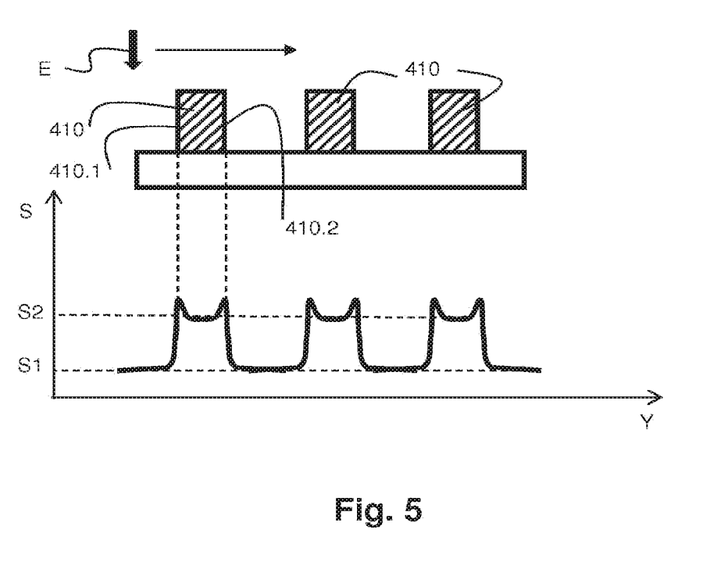
FIG. 5 schematically depicts a cross-sectional view of the structure of FIG. 4 and a signal as may be obtained during the scanning of such a structure.

FIG. 5 schematically shows a cross-sectional view of the sample part shown in FIG. 4 together with a signal S as detected by an inspection tool, when an electron beam E scans such sample along the scan direction, indicated as the Y-direction.

As can be seen, when the scanning electron beam E, scanning in the indicated Y-direction, encounters a line 410, a change in the detected signal can be observed during every transition that is encountered along the scan direction. Such a transition, e.g. due to a change in geometry or a change in material, may then be used to identify a position of the changed geometry or material.

In the example shown, the occurrence of a line 410 across the scan trajectory that is followed, results in a transition from a first signal level S1 to a second signal level S2 and back to the first signal level S1. Based on such a variation of the signal S along the scan trajectory, the position of the line, in particular the position of the edges 410.1 and 410.2 of the line may e.g. be determined as occurring at positions where the signal S is e.g. half way between the first signal level and the second signal level.

By assessing where the edges of the lines occurs, based on the detected signal along various scan trajectories, one can obtain an image of the field of view in which the edges of the lines of the sample can be found, i.e. where transitions in the detected signal obtained by scanning along a scan trajectory are found.

As such, when a sample as shown in FIG. 4 is scanned, an image can be obtained which allows determining where the edges of the lines 410 are located, thus allowing to determine the location of the lines and allowing an assessment of the accuracy of the lines, which can be considered a measure to assess the quality of the lithographic process.

Figure 6:
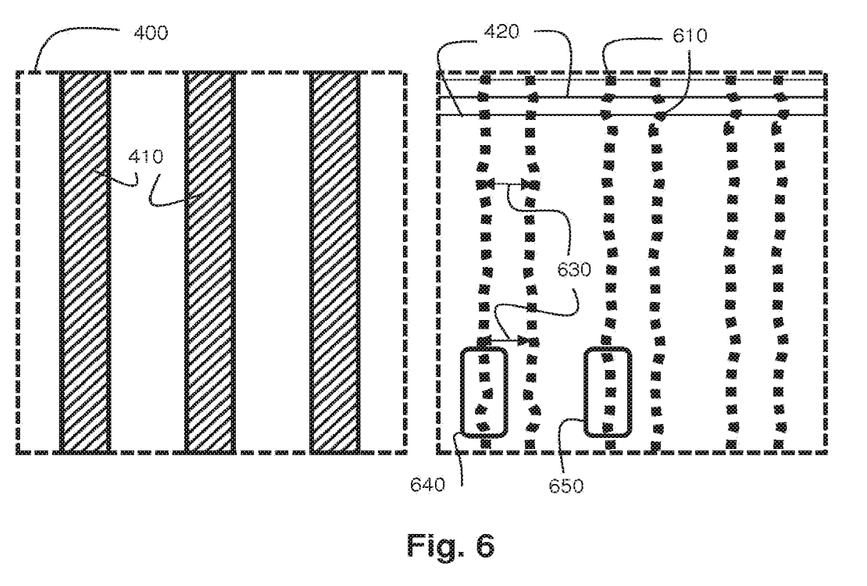
FIGS. 6 and 7 schematically depict an image as can be obtained by scanning the structure of FIG. 4, in undistorted and distorted form.

FIG. 6 highly schematically shows, for a field of view 400 covering a sample portion in which three parallel lines 410 are present, where transitions are detected when the sample is scanned along scan trajectories 420. On the right side of FIG. 6, the transitions are indicated by the dots 610, the dots e.g. corresponding to positions where a detector signal during a scanning along a scan trajectory changes. As such, the position of the dots or transitions 610 can be considered representative for the position of the edge of the lines 410. The transitions 610 may also be referred to as edge position measurements or edge measurements. Based on an image as schematically shown on the right in FIG. 6, one may determine various parameters to assess the quality of the processes applied to generate the sample. Such parameters may e.g. include CD (critical dimension) and CD uniformity, LER (line edge roughness), LWR (line with roughness) and pitch. As an example, in order to determine the LER, one can e.g. compare the determined positions of an edge with an average of the determined positions. As another example, one may determine the CD at a particular location along a line as the distance between the detected edges of the line at that location, as e.g. indicated by arrows 630. By determining the CD at various locations along a line, the uniformity or variation of the CD can be determined. As yet another example, a pitch of the lines, i.e. a distance between two adjacent lines may be determined as well, based on the detected transitions 610. In order to determine the pitch between two lines, one may e.g. determine the distance between the first edge of the first line (i.e. the edge that is encountered first during a scan) and the first edge of the second line. In order for the pitch as determined not to be affected by the LER, one can e.g. determine an average position of the first edge of the first line, e.g. averaged over a line segment and determine an average position of the first edge of the second line, e.g. averaged over a line segment of the second line corresponding to the line segment of the first line. With reference to FIG. 6, a pitch between the first line and the second line can e.g. be determined by comparing an average position of an edge of the first line, e.g. obtained by averaging the determined transitions 610 observed in the portion 640 of the first line with an average position of an edge of the second line, e.g. obtained by averaging the determined transitions 610 observed in the portion 650 of the second line. Such a position measurement, whereby a position of an edge of a line is compared with a position of an edge of an adjacent line may also be referred to as a gap measurement. Such a gap measurement thus results in a determination of a distance between two edges of adjacent lines in the direction of the scanning, i.e. perpendicular to the direction of the lines.

As will be appreciated by the skilled person, the accuracy at which the parameters such as LER, LWR or pitch can be determined, may strongly rely on both the accuracy at which the positions of the transitions 610 can be determined and on the reliability of the measurements.

In order to improve the accuracy of the measurement, a field of view may be scanned several times and the obtained scans of the field of view, also referred to as frames, may be averaged.

With respect to the reliability of the measurements, the following can be mentioned:

In order to make a proper assessment of the performance of the lithographic apparatus, one needs to rely that an image of the patterned structure as generated by the inspection tool, the image e.g. indicating the scanned structure, is an accurate representation of the actual structure as patterned by the lithographic apparatus. In case one cannot rely on such correspondence, one cannot assess whether any observed defects are caused by the actual patterning process, performed by the lithographic apparatus, or whether the observed defects are caused by an inaccurate imaging process, performed by the inspection tool.

When a patterned structure comprising a plurality of substantially parallel lines is examined, e.g. to assess the critical dimension (CD) uniformity or other parameters as discussed, there may be various causes why an image of the patterned structure, as obtained from the inspection tool, may deviate from the actual geometry of the patterned structure. Typically, in order to improve the measurement accuracy, an image of a patterned structure is obtained by scanning an area of interest multiple times and combining the obtained scans into one image. Within the meaning of the present disclosure, a single scan across an area of interest, or field of view, is referred to as a frame. An image of an area of interest is thus obtained by combining, e.g. averaging, multiple frames.

During the scanning of a patterned structure using an electron beam, the patterned structure may be affected by the electron beam. As an example, when a patterned structure comprising parallel lines made from a resist are scanned, the lines may deteriorate with every scan that is made. This phenomenon is known as resist shrinkage.

Another cause for deviations between the actual patterned structure and an image of the structure obtained by a SEM inspection tool is the charging of the structure by the applied electron beam. Due to the application of an electron beam, the sample or specimen that is being examined may become charged. As a result of this charging, the trajectory of the electron beam may be affected. As a result, the measurement process may be affected, resulting in a deviation between the characteristics, e.g. geometry, of the actual patterned structure and the measured patterned structure, e.g. represented by an image of the patterned structure as obtained by the inspection tool. As an example of such a deviation, a rotation of the image may be observed. Typically, an inspection tool may be configured to correct for such a rotation of the image.

Yet another cause for deviations between the actual patterned structure and the measurements of the structure as e.g. represented by an image of the structure obtained by a SEM inspection tool is a phenomenon known as distortion. In case a patterned structure comprising a plurality of substantially straight parallel lines is scanned, e.g. a plurality of times, the obtained image of the patterned structure may be distorted; instead of parallel, straight lines, the image representing the measured positions of the lines may show curved lines that need not be parallel. Such a distortion is deemed to be caused by a.o. electromagnetic disturbances affecting the electron beam.

Figure 7:
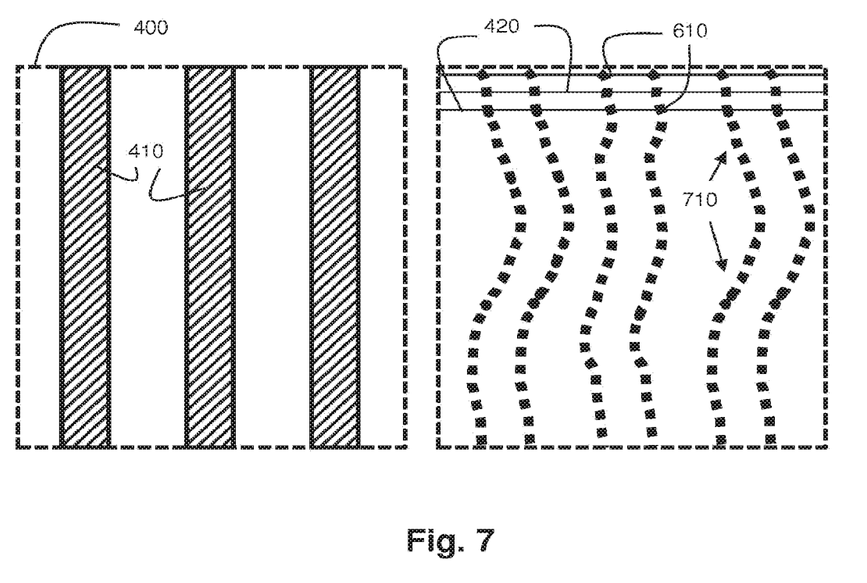

FIG. 7 schematically shows the effect of such a distorted pattern of lines. FIG. 7 schematically shows, on the left side, a field of view 400 covering a sample portion in which three parallel lines 410 are present. On the right, FIG. 7 highly schematically shows where transitions, e.g. representing the edges of the lines, are detected. As can be seen, during the scanning process whereby sequentially scans along the scan trajectories 420 are performed, a shift along the scan direction of the transitions, indicated by the dots 610, can be observed. It should be pointed out that this distortion as perceived, does not correspond to an actual distortion of the patterned lines. As such, as will be appreciated by the skilled person, when the distorted pattern as measured is used as a basis to assess certain parameters characterizing the performance of lithographic process, this could adversely affect the assessment. As an example, in case the measurements of the first edge of the third line, indicated by the curved dotted line 710 would be used to determine a value for the LER, the line edge roughness would be overestimated. Other parameters such as a CD value may however be less affected.

It would however be advantageous to take account of a distortion that affects the measurements of an inspection tool that is used to assess the quality of lithographic processes.

In accordance with some aspects of the present disclosure, a method is proposed to determine a distortion of a SEM inspection tool.

Once the distortion of a tool is known, this known distortion can e.g. be applied to correct inspection data obtained by scanning other structures. As an example, a SEM inspection tool may e.g. be applied to assess a local placement error (LPE) of e.g. contact holes. When the distortion or distortion pattern of the SEM tool is known, a more accurate assessment of the actual LPE can be obtained, by correcting for the distortion.

In some embodiments of the present disclosure, the distortion is determined by determining, for a plurality of line segments of a plurality of lines, e.g. available within a field of view of the SEM, the distance between the line segments, e.g. based on edge measurements. In case the distance between line segments of the same line is determined, in particular the distance in the scan direction, this can be considered a measure for the distortion.

Ideally, one would expect that the distance between two line segments of the same line, in the scan direction, would be zero. Due to the distortion however, the distance, considered in the scan direction, between two line segments, e.g. two adjacent line segments, may vary along the line.

Within the meaning of the present disclosure, a line segment refers to a portion of a line on a sample, whereby the line segment has been scanned by a plurality of scans along a plurality of scan trajectories. Or, phrased differently, a line segment is crossed or traversed by a plurality of scan trajectories. As an example, in case a sample is scanned by 100 scan trajectories, such as trajectories 420, one may e.g. subdivide a line, such as line 410 into 10 line segments, each line segment being scanned along 10 scan trajectories. By determining the distance between such line segments, one can assess the distortion of the field of view of the inspection tool. This is illustrated in more detail in FIG. 8.

Figure 8:
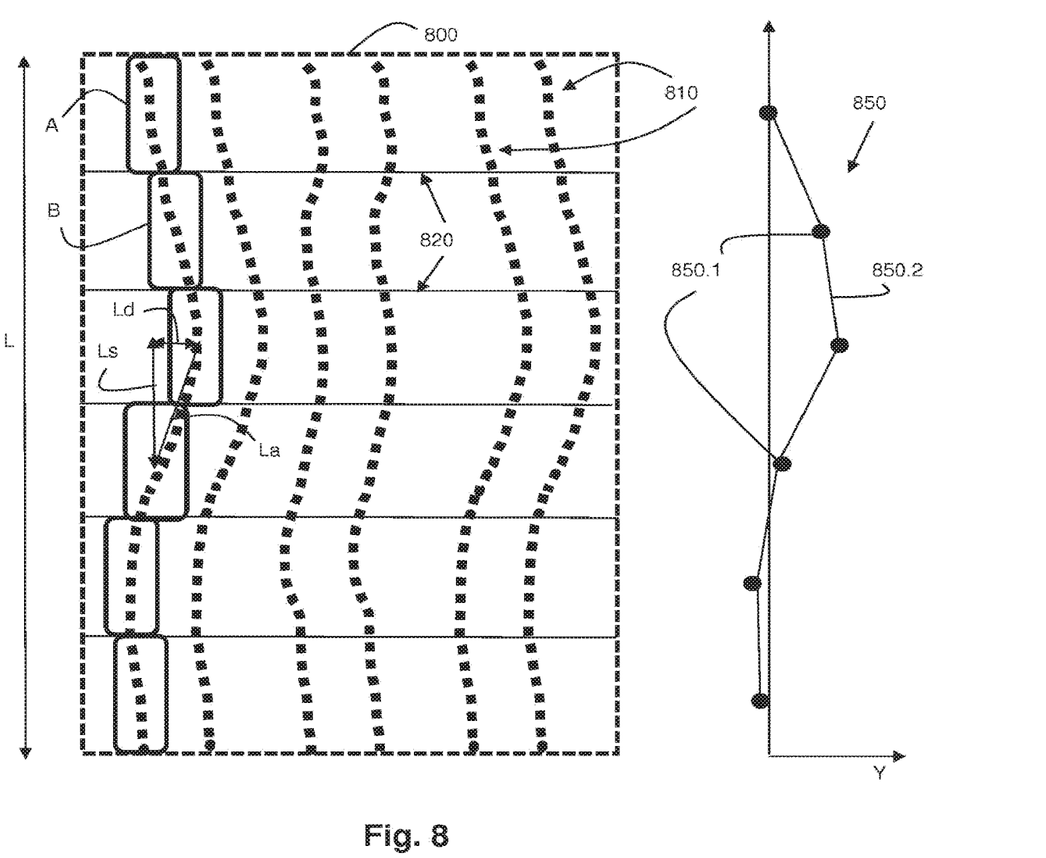
FIG. 8 schematically depicts the process of determining a distortion across a field of view, based on distance measurements.

FIG. 8 schematically shows, in more detail, a distorted image of a sample comprising three lines, similar to the right portion of FIG. 7. In FIG. 8, the dotted lines 810 represent the edge measurements as obtained from scanning the sample along a plurality of scan trajectories. In the arrangement as shown, the lines are subdivided into 7 sections or segments, indicated by the lines 820. As can be seen, each section or segment is crossed or traversed by approx. 7 scan trajectories, since each line section or segments contains approx. 7 measurement points per edge and per line.

In order to determine the distortion of the field of view 800 of the inspection tool, a distance measurement is applied in some embodiments of the present disclosure. In particular, with reference to FIG. 8, a distance measurement may be applied between the different line segments of a line. In particular, as can be seen in FIG. 8, the first edge of the first line, i.e. indicated by the most left dotted line 810, is subdivided into 6 sections or segments, each comprising 7 edge measurements. As can be seen, the 6 segments are not in line along the scan direction.

In some embodiments of the present disclosure, the distance between two line segments is determined. As an example, the distance between the uppermost line segment of the first line, characterized by the edge measurements A and the adjacent line segment of the first line, characterized by the edge measurements B, can be determined. Based on said determined distance, one may e.g. derive a displacement of the second segment relative to the first segment in the scan direction.

Since in general, the distance in the X-direction, i.e. along the lines 410, between the segments is known, (since the overall length of the field of view along the X-direction (indicated as L) is known, the length of each segment is known as well. A distance in the X-direction between adjacent segments is thus known as well. In case a determined distance between two segments, e.g. based on the edge measurements characterizing the segments, would deviate from the expected distance, the line segments need to be displaced relative to each other in the scan direction. This is illustrated in FIG. 8 where Ls is the (known) distance in the X-direction between the third line segment, characterized by the edge measurements C, and the fourth line segment, characterized by the edge measurements D, and La is the actual distance between the segments, e.g. determined as the distance between the average of the edge measurements C and the average of the edge measurements D. Based on expected distance between the segments (Ls) and the actual distance (La), one can determine the displacement along the scan direction (Ld), which can be considered a measure for the distortion of the field of view 800 at the location of the examined segments.

In some embodiments, the distance between the selected line segments, e.g. the first and second line segments, can be obtained by performing a gap measurement as discussed above. Note that typically, a gap measurement is performed between line segments of different lines, e.g. to determine a pitch between the lines. However, by performing the gap measurement on two line segments of the same line, one can obtain information about the relative position of the line segments in the scan direction.

In some embodiments, the displacement along the scan direction between adjacent line segments may be determined at a plurality of locations within the field of view. As such, a map of the distortion across the field of view can be determined. In FIG. 8, the graph 850 illustrates the relative position of the 6 line segments along the scan direction, i.e. the Y-direction, whereby the dots 850.1 indicate the determined relative position of each segment.

In some embodiments, the distortion of a line or along a line as perceived in a SEM image of a sample can be determined as a piece-wise linear curve constructed using the determined relative positions of the segments of the line. Such a piece-wise linear curve is shown in FIG. 8 as graph 850.2.

When considering the entire array of edge measurements indicating where an edge of a line has been detected, one can consider the distortion, e.g. represented by a piece-wise linear curve, to be a low frequency approximation of the position of the edge. As will be appreciated by the skilled person, this low frequency curvature, which has been caused by disturbances and does not correspond to an actual curvature of the line of the sample, can be used to correct the edge measurements, thus at least partly eliminating the influence of the distortion on the process parameters that are to be assessed, e.g. LER or LWR.

By determining the distortion, as indicated above, over the entire field of view, one can obtain a two-dimensional representation of the distortion. In order to obtain a substantially continuous representation of the distortion across the field of view or along a line, i.e. either a one-dimensional or a two-dimensional representation, other fitting or mapping techniques, apart from a piece-wise linear fitting, may be considered as well. As an example, a one or two-dimensional polynomial fitting may be considered as well.

When such a two-dimensional representation of the distortion is determined, it can e.g. be used to correct measurements of scanned samples. As an example, a SEM inspection tool may also, apart from the process parameters as discussed above, be applied to assess geometric properties of patterned structures such as contact holes, in particular the relative position of such contact holes. Using the above described approach, a determined relative position of contact holes on a sample, e.g. based on a scanning of the sample as described above, may be corrected for distortion when said distortion has been determined beforehand. As a result, a more accurate determination of the positioning of the contact holes on the sample can be obtained.

The methods as described above to determine a distortion across a field of view of an inspection tool such as a SEM inspection tool may be implemented in an inspection tool according to some embodiments of the present disclosure. Some embodiments of such an inspection tool may e.g. be characterized by the following features:

an object table configured to receive a sample comprising a plurality of substantially parallel lines extending in a first direction;
an e-beam source configured to generate an e-beam;
a beam manipulator configured to direct the electron onto the sample;
a detector configured to detect a response signal of the sample caused by interaction of the electron beam with the sample;
a control unit configured to control the beam manipulator to performing a plurality of scans across the field of view of the sample along a respective plurality of scan-trajectories extending in a scan direction; the scan direction being substantially perpendicular to the first direction, wherein the control unit is further configured to perform, for a plurality of locations within the field of view, the step of determining a distance between a first line segment of a line and a second line segment of the line, whereby each of the first line segment and the second line segment are crossed by a plurality of scan trajectories, based on the response signal of the sample during the scanning, and is configured to determine the distortion across the field of view, based on the determined distances at the plurality of locations. In such embodiments, the control unit may e.g. comprises a processing unit and a memory unit, whereby the latter may e.g. be applied to store the response signal as received by the detector during the scanning process along the plurality of scan trajectories and whereby the former, i.e. the processing unit is configured to process the received response signal as indicated to determine the distortion.

Figure 9:
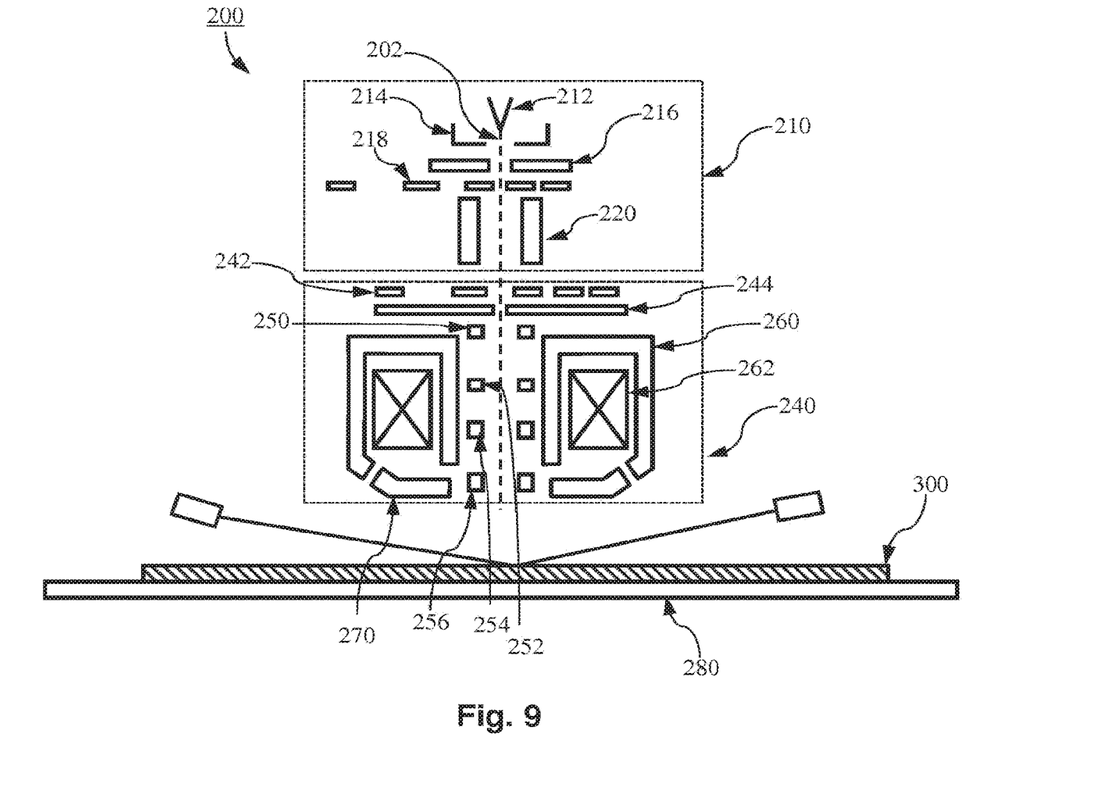
FIG. 9 schematically depicts a cross-sectional view of an inspection tool according to some embodiments of the present disclosure.

FIG. 9 schematically depict a more detailed example of an inspection tool 200 according to some embodiments of the present disclosure. The inspection tool 200 comprises an e-beam source, referred to as the electron gun 210 and an imaging system 240.

The electron gun 210 comprises an electron source 212, a suppressor electrode 214, an anode 216, a set of apertures 218, and a condenser 220. The electron source 212 can be a Schottky emitter or modified Schottky emitter as discussed above. By the positive charge of the anode 216, the electron beam 202 can be extracted, and the electron beam 202 may be controlled by using a tunable aperture 218 which may have different aperture sizes for eliminating the unnecessary electron beam outside of the aperture. In order to condense the electron beam 202, the condenser 220 is applied to the electron beam 202, which also provides magnification. The condenser 220 shown in the FIG. 2 may e.g. be an electrostatic lens which can condense the electron beam 202. On the other hand, the condenser 220 can be also a magnetic lens.

The imaging system 240 may e.g. comprise a blanker 248, a set of apertures 242, a detector 244, four sets of deflectors 250, 252, 254, and 256, a pair of coils 262, a yoke 260, and an electrode 270. The electrode 270 is used to retard and deflect the electron beam 202, and further has electrostatic lens function due to the combination of upper pole piece and sample 300. Besides, the coil 262 and the yoke 260 are configured to the magnetic objective lens.

The deflectors 250 and 256 can be applied to scan the electron beam 202 to a large field of view, and the deflectors 252 and 254 can be used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 may not be damaged. In order to correct the chromatic aberration of the electron beam 202, the retarder 270, the sample 300, and the upper pole piece form a lens to eliminate the chromatic aberration of the electron beam 202.

As mentioned, the inspection tool may further comprises a control unit. In some embodiments, said control unit may both control the electron gun 210 and the imaging system 240. The control unit may further be configured to process measurement data obtained during the scanning of the field of view and determine the distortion across the field of view or a part thereof.

Embodiments of the present disclosure may further be described using the following clauses:

1. A method of determining a distortion of a field of view of a scanning electron microscope, the method comprising:
   providing a sample comprising a plurality of substantially parallel lines extending in a first direction;
   performing a plurality of scans across the field of view of the sample along a respective plurality of scan-trajectories extending in a scan direction; the scan direction being substantially perpendicular to the first direction;
   detecting a response signal of the sample caused by the scanning of the sample;
   determining a distance between a first line segment of a line and a second line segment of the line, whereby each of the first line segment and the second line segment are crossed by a plurality of scan trajectories, based on the response signal;
   performing the previous step for a plurality of locations within the field of view and
   determining the distortion across the field of view, based on the determined distances at the plurality of locations.
2. The method according to clause 1, wherein each line segment is being crossed by a subset of the plurality of scans, the subset comprising a plurality of scan trajectories.
3. The method according to clause 1 or 2, wherein the distance is a distance in the scan direction.
4. The method according to clause 1 or 2, wherein the step of determining a distance comprises determining a position of the second line segment relative to the first line segment in the scan direction.
5. The method according to clause 1 or 2, wherein the distance is determined by performing a gap measurement between the first line segment and the second line segment.
6. The method according to any of the preceding clauses, wherein the distortion comprises the relative position of the line segments.
7. The method according to any of the preceding clauses, wherein the step of determining the distortion comprises performing a one- or two-dimensional fitting based on the determined distances.
8. The method according to clause 7, wherein the one- or two-dimensional fitting comprises a piece-wise linear fitting.
9. the method according to clause 6, wherein the distortion comprises a piece-wise linear curve, based on the relative position of the line segments.
10. The method according to any of the preceding clauses, wherein the distance is determined based on edge measurements of the line segments.
11. An inspection tool comprising:
   an object table configured to receive a sample comprising a plurality of substantially parallel lines extending in a first direction;
   an e-beam source configured to generate an e-beam;
   a beam manipulator configured to direct the electron onto the sample;
   a detector configured to detect a response signal of the sample caused by interaction of the electron beam with the sample;
   a control unit configured to control the beam manipulator to performing a plurality of scans across the field of view of the sample along a respective plurality of scan-trajectories extending in a scan direction; the scan direction being substantially perpendicular to the first direction, wherein the control unit is further configured to perform, for a plurality of locations within the field of view, the step of determining a distance between a first line segment of a line and a second line segment of the line, whereby each of the first line segment and the second line segment are crossed by a plurality of scan trajectories, based on the response signal of the sample during the scanning, and is configured to determine the distortion across the field of view, based on the determined distances at the plurality of locations.
12. The inspection tool according to clause 11, wherein the control unit is configured to determine the distortion by performing a one- or two-dimensional fitting based on the determined distances.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that embodiments of the present disclosure may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present disclosure have been described above, it will be appreciated that some embodiments of the present disclosure may be practiced otherwise than as described. For example, some embodiments of the present disclosure may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to embodiments of the present disclosure as described without departing from the scope of the claims set out below.

What is claimed is:

1. A method of determining a distortion of a field of view of a scanning electron microscope, comprising:
   providing a sample comprising a plurality of substantially parallel lines extending in a first direction;
   performing a plurality of scans across the field of view of the sample along a respective plurality of scan-trajectories extending in a scan direction; the scan direction being substantially perpendicular to the first direction;
   detecting a response signal of the sample caused by the scanning of the sample;
   determining a distance between a first line segment of a line and a second line segment of the line, whereby each of the first line segment and the second line segment are crossed by a plurality of scan trajectories, based on the response signal;
   performing the previous step for a plurality of locations within the field of view; and
   determining the distortion across the field of view, based on the determined distances at the plurality of locations.

2. The method of claim 1, wherein each line segment is being crossed by a subset of the plurality of scans, the subset comprising a plurality of scan trajectories.

3. The method of claim 1, wherein the distance is a distance in the scan direction.

4. The method of claim 1, wherein the determining a distance comprises determining a position of the second line segment relative to the first line segment in the scan direction.

5. The method of claim 1, wherein the distance is determined by performing a gap measurement between the first line segment and the second line segment.

6. The method of claim 1, wherein the distortion comprises the relative position of the line segments.

7. The method of claim 6, wherein the distortion comprises a piece-wise linear curve, based on the relative position of the line segments.

8. The method of claim 1, wherein the determining the distortion comprises performing a one- or two-dimensional fitting based on the determined distances.

9. The method of claim 8, wherein the one- or two-dimensional fitting comprises a piece-wise linear fitting.

10. The method of claim 1, wherein the distance is determined based on edge measurements of the line segments.

11. An inspection tool comprising:
    an object table configured to receive a sample comprising a plurality of substantially parallel lines extending in a first direction;
    an e-beam source configured to generate an e-beam;
    a beam manipulator configured to direct the electron onto the sample;
    a detector configured to detect a response signal of the sample caused by interaction of the electron beam with the sample;
    a control unit configured to control the beam manipulator to performing a plurality of scans across the field of view of the sample along a respective plurality of scan-trajectories extending in a scan direction; the scan direction being substantially perpendicular to the first direction, wherein the control unit is further configured to perform, for a plurality of locations within the field of view, determining a distance between a first line segment of a line and a second line segment of the line, whereby each of the first line segment and the second line segment are crossed by a plurality of scan trajectories, based on the response signal of the sample during the scanning, and is configured to determine the distortion across the field of view, based on the determined distances at the plurality of locations.

12. The inspection tool of claim 11, wherein the control unit is configured to determine the distortion by performing a one- or two-dimensional fitting based on the determined distances.

* * * * *